United States Patent [19]

Ohtani

[11] Patent Number: 4,730,279
[45] Date of Patent: Mar. 8, 1988

[54] STATIC SEMICONDUCTOR MEMORY DEVICE

[75] Inventor: Takayuki Ohtani, Tokyo, Japan

[73] Assignee: Kabushiki Kaisha Toshiba, Kawasaki, Japan

[21] Appl. No.: 842,441

[22] Filed: Mar. 21, 1986

[30] Foreign Application Priority Data

Mar. 30, 1985 [JP] Japan .................................. 60-66901
Sep. 6, 1985 [JP] Japan ................................ 60-197129

[51] Int. Cl.$^4$ ................................................ G11C 7/00
[52] U.S. Cl. .................................... 365/203; 365/230; 365/190
[58] Field of Search ............... 365/203, 190, 154, 202, 365/230

[56] References Cited

U.S. PATENT DOCUMENTS 4,379,344  4/1983  Ozawa et al. ......................... 365/203
4,494,221  1/1985  Hardee et al. ........................ 365/203
4,499,559  2/1985  Kurafuji ................................ 365/190

OTHER PUBLICATIONS

Yamamoto et al., "A 256K CMOS SRAM with Variable-Impedance Loads," IEEE International Solid-State Circuits Conference, ISSCC, pp. 58–59, 1985.

Primary Examiner—Joseph A. Popek
Attorney, Agent, or Firm—Finnegan, Henderson, Farabow, Garrett & Dunner

[57] ABSTRACT

A memory cell array consists of a plurality of memory sections. A pair of bit lines are provided for each column, and word lines are provided each for each row in each memory section. One end of the current path of a first transistor is connected to the corresponding bit line. A predetermined voltage is applied to the other end of the current path of the first transistor. One end of the current path of a second transistor is connected to the corresponding bit line. A predetermined voltage is applied to the other end of the current path of the first transistor. The current capacity of the first transistor is larger than that of the second transistor. After an address signal varies and a predetermined period elapses, the first transistor in the selected section turns on, the second transistor in the selected section turns off, the first transistor in the nonselected section turns off, and the second transistors in the nonselected section turns on. The bit lines in the selected section are charged for a predetermined period of time after the address signal changes, to pull up the voltages of the bit lines in the nonselected section to a power supply voltage. A row decoder renders the word line active in level after the first transistor connected to the bit lines of the selected section is turned off according to an address signal.

11 Claims, 29 Drawing Figures

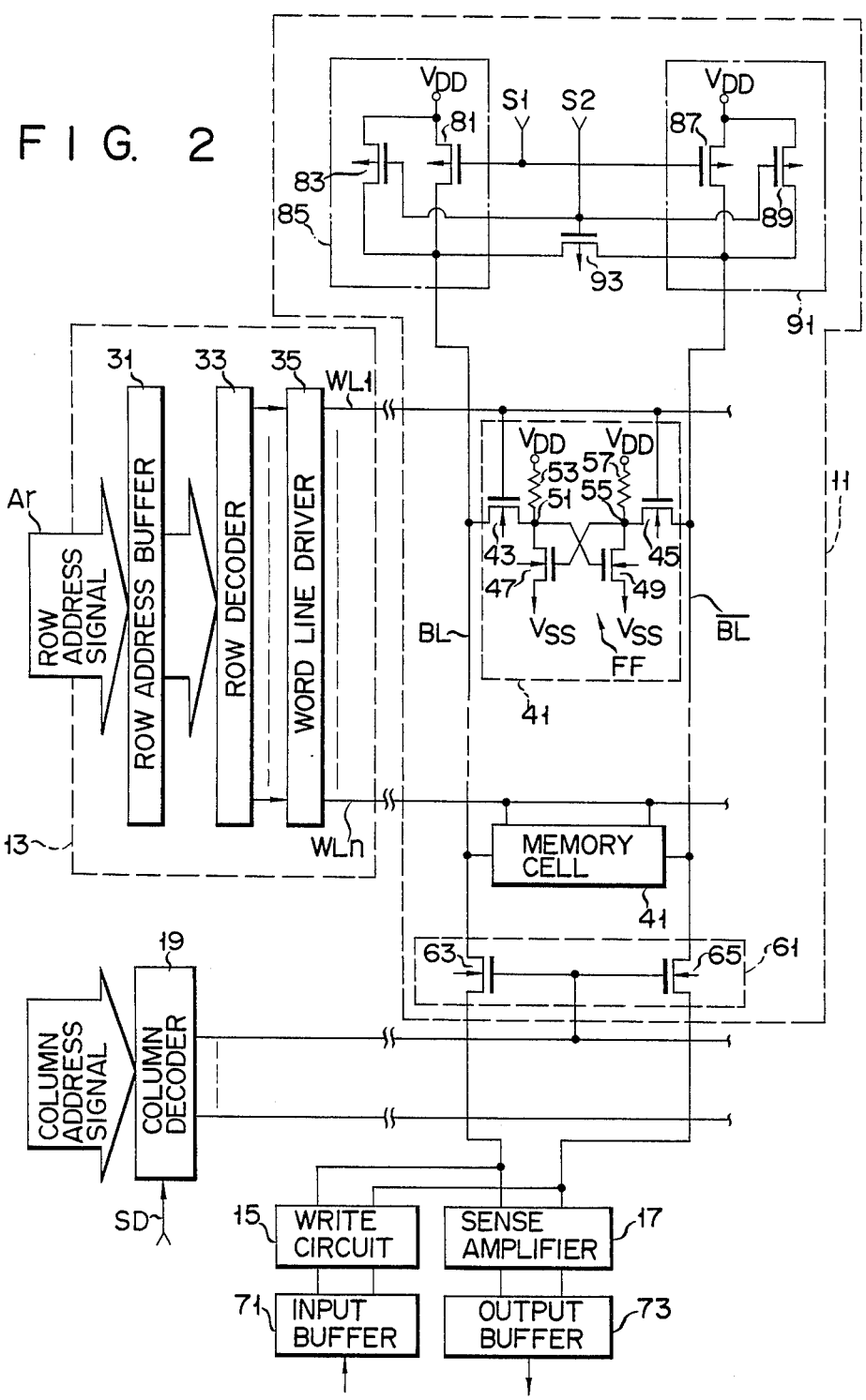

FIG. 3A  AC
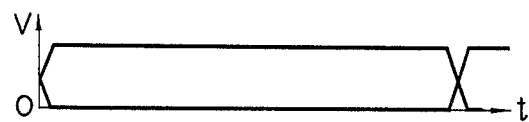
FIG. 3B  S1
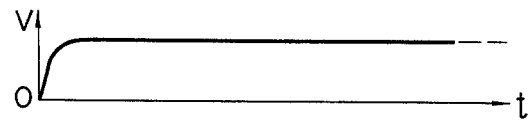
FIG. 3C  $\overline{S1}$
FIG. 3D  S2 (SELECTED)
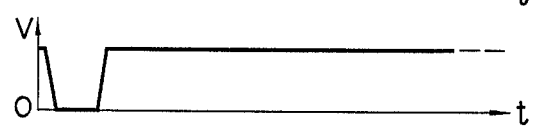
FIG. 3E  S2 (NON-SELECTED)
FIG. 3F  WL
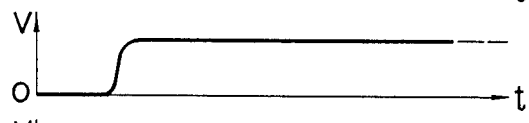
FIG. 3G  BL (SELECTED)
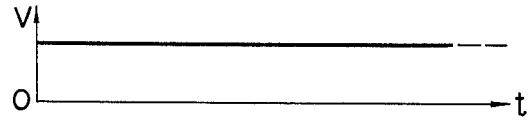
FIG. 3H  $\overline{BL}$ (SELECTED)
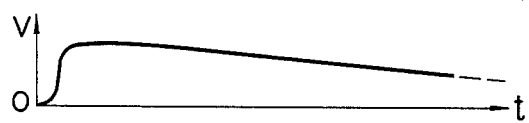
FIG. 3I  BL (NON-SELECTED)
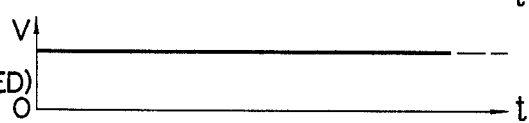
FIG. 3J  $\overline{BL}$ (NON-SELECTED)

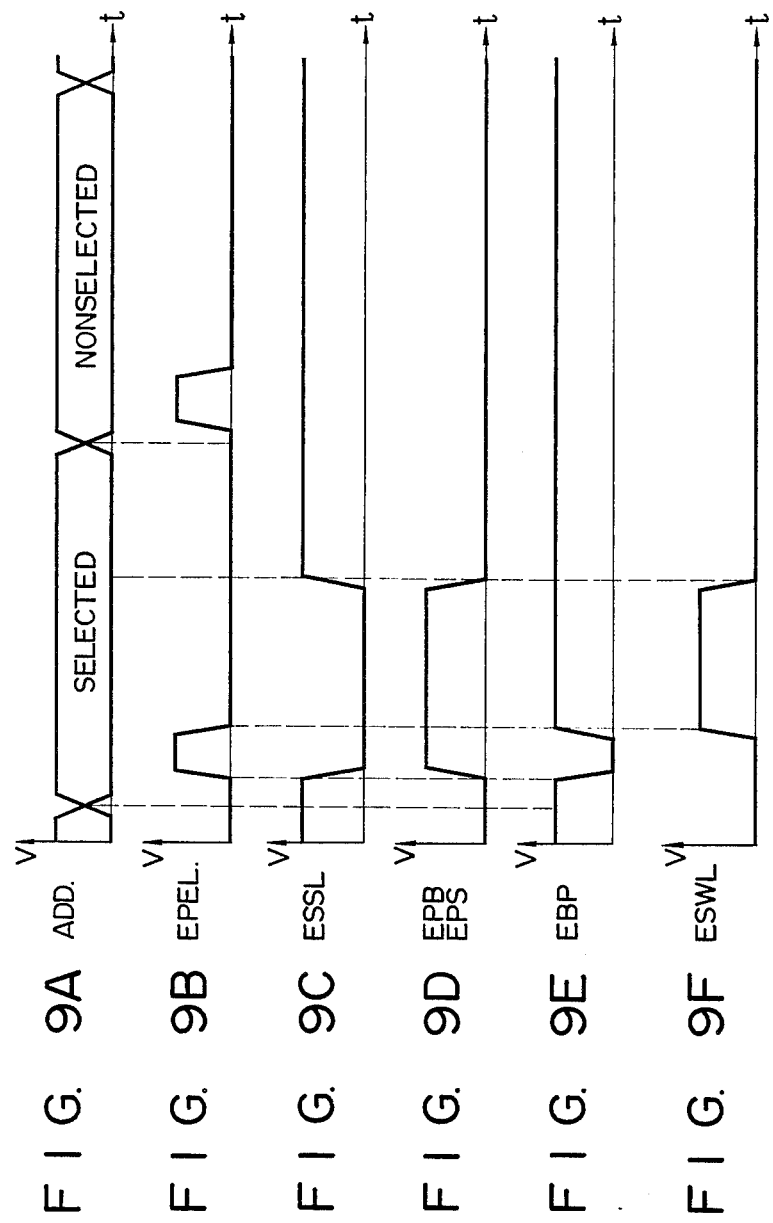

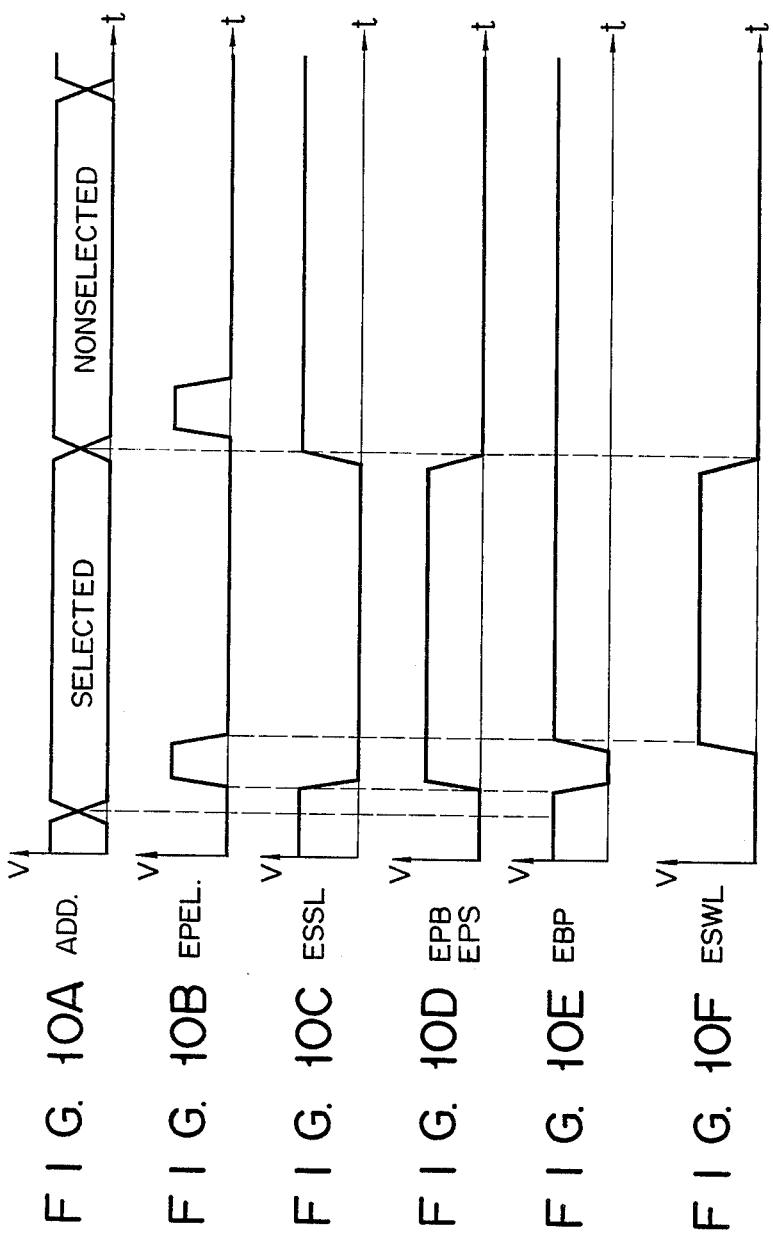

STATIC SEMICONDUCTOR MEMORY DEVICE

BACKGROUND OF THE INVENTION

The present invention relates to an improved semiconductor memory device, and more particularly to an improved method for driving bit lines of the memory device.

To operate a static semiconductor memory device (S-RAM) at a high speed, there has been proposed a method in which the amplitude of the varying voltage in bit lines is reduced in the readout mode of the memory device. In the memory device based on this method, load elements of bit lines, transfer gates of memory cells, and transistors to drive the memory cells are turned on in the read out mode. The voltage in the bit line through which data "0" is read out is set between power source voltage and ground voltage. Such a memory device is disclosed by O. Minato in his paper "A HIGH COMOS II8k×8b Static RAMs" of "1982 IEEE International Solid-state Conference, DIGEST OF TECHNICAL PAPERS", or in "A 256k CMOS SRAM Variable-Impedance Loads" of "1985 International Solid-State Conference, DIGEST OF TECHNICAL PAPERS". In this type of memory device, current (through-current) flows through a path between a power voltage application point and ground. The memory device has a number of columns. For this reason, in the read out mode, the current flows into bit lines in the unselected columns. When each memory section consists of 128 columns, and the number of addressable columns is 8, the through-current also flows through all of the remaining columns of 120. It is for this reason that the conventional memory device consumes a lot of current.

The constant need for faster data processing rates, and higher memory device package density, creates a need for faster RAMs.

SUMMARY OF THE INVENTION

Accordingly, an object of the present invention is to provide a semiconductor memory device with higher performance.

To achieve the above object, there is provided a semiconductor memory device comprising: a memory cell array including memory cells (41) arranged in a matrix, the array divided into a plurality of sections; paired bit lines (BL, $\overline{BL}$) for writing and reading out data to and from selected memory cells (41), a pair of bit lines being provided for each column and connected to memory cells (41) in the corresponding column; word lines (WL) connected to corresponding memory cells (41) to select memory cells (41) in the row direction; and precharge means (81 to 93) connected to the bit lines (BL, $\overline{BL}$), the precharge means responsive to an address signal, to charge (precharge) during a predetermined period the bit lines (BL, $\overline{BL}$) in at least one selected section (11) after the address signal varies, and to charge (pull-up) the bit lines (BL, $\overline{BL}$) in at least one nonselected section (11).

With such an arrangement, a "through current" does not flow through the bit lines, so that the power dissipation of the memory device is reduced. It is only during a fixed period of time after an address signal varies that the bit lines are charged to power voltage by a bit line precharge means. In the conventional memory device, the bit lines are always pulled up by a bit line load circuit. When comparing with the conventional device, the memory device according to the present invention needs a shorter period of time taken for the voltage of the bit lines to fall off when reading out or writing data "0". This fact indicates that reduced time is required for reading out or writing data in the memory device.

BRIEF DESCRIPTION OF THE DRAWINGS

FIG. 2 shows a circuit diagram for illustrating the structure of one column of the memory device shown in FIG. 1;

FIGS. 3A to 3J show signal waveforms for explaining the operation of the memory device with the structure shown in FIGS. 1 and 2;

FIGS. 9A to 10F show a set of waveforms useful in explaining the operation of the memory device shown in FIGS. 7 and 8.

DETAILED DESCRIPTION OF THE PREFERRED EMBODIMENTS

The preferred embodiments of the present invention will be described in detail referring to the accompanying drawings.

Figure 1:
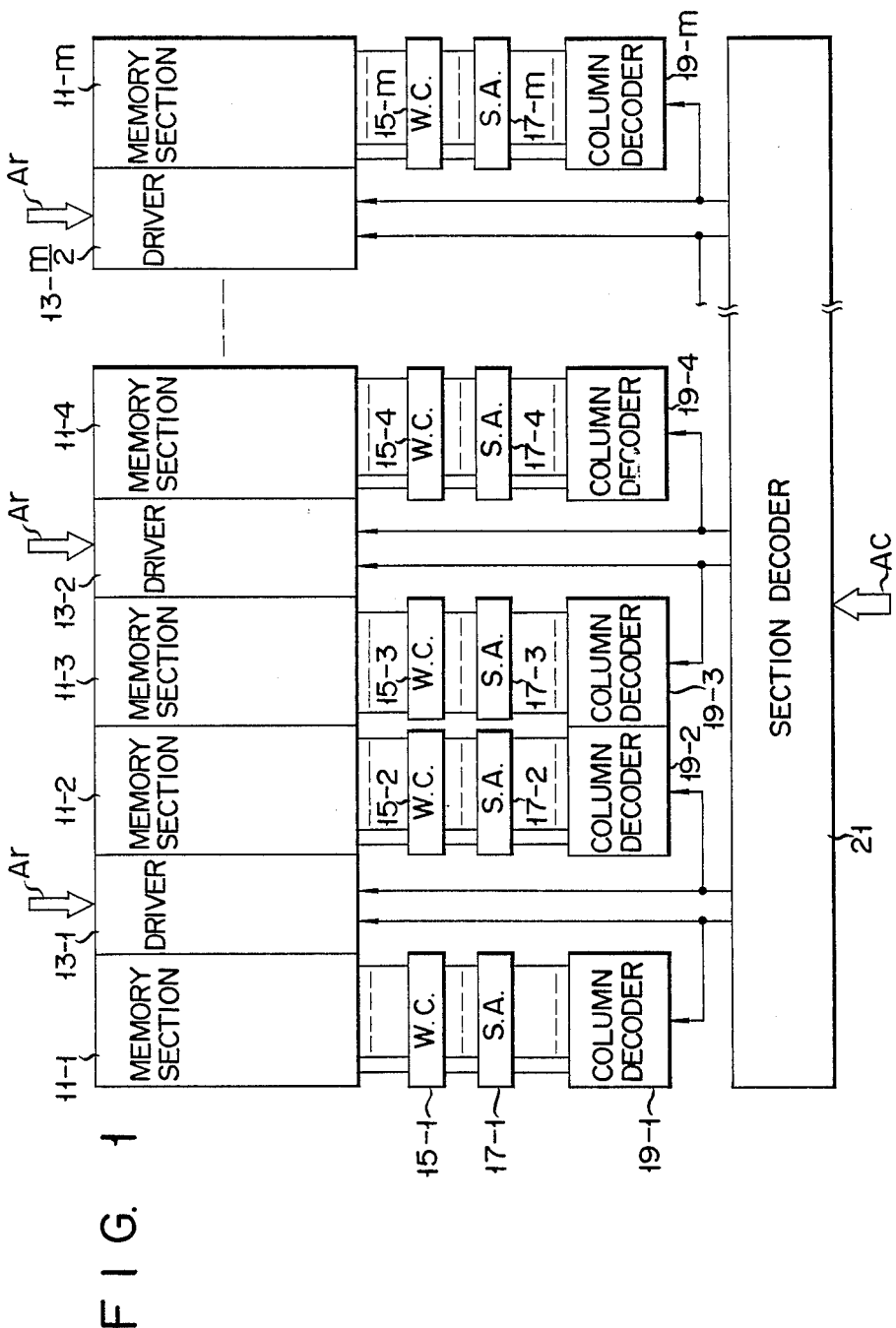
FIG. 1 shows a block diagram useful in explaining the structure of a static memory device according to an embodiment of the present invention.

Referring to FIG. 1, there is shown an overall structure of a static memory device according to an embodiment of the present invention. A memory area of the memory device comprises a plurality of memory sections. In FIG. 1, the memory area comprises m (m=any even number) sections 11-1 to 11-m. Each memory section as generally designated by 11 contains a plurality of memory cells arrayed in a matrix. In each memory section 11, a plurality of bit lines each interconnect memory cells on the same row of the memory matrix. A plurality of word lines each interconnect memory cells on the same column.

Memory sections 11 are paired. A plurality of drivers 13-1 to 13-m are provided, each being disposed between each pair of memory sections. More specifically the first and second memory sections 11-1 and 11-2 form a first pair. First driver 13-1 is sandwiched between these memory sections. These drivers generally designated by 13 receive a row address signal Ar and a section select signal. Each driver 13 selectively drives a word line specified by row address signal Ar and the section select signal.

Connected to each memory section are write circuit 15 and sense amplifier 17. Although not shown in FIG. 1, each write circuit 15 actually contains an input buffer, and each sense amplifier 17 contains an output buffer.

Each memory section 11 is connected to column decoder 19. A column decoder 19 receives a column address signal and a section select signal to the bit lines as specified by a column address signal in the selected section 11. Further connected to the column decoders 19 is a section decoder 21. The section decoder 21 receives a column address signal Ac of 16 bits, for example. The section decoder 21 selectively drives one driver 13 and one column decoder 19, which are specified by column address signal Ac. As a result, one memory section 11 is selected to allow only the memory cells in the selected memory section 11 to be selected.

Memory section 11, driver 13, write circuit 15, sense amplifier 17, column decoder 19, and section decoder 21 will be described in detail referring to FIG. 2. Since the columns have the same arrangements, the arrangement of only one column will typically be described.

A row address signal Ar is input to row address buffer 31. Row address signal Ar derived from row address buffer 31 is supplied to row decoder 33. Row decoder 33 decodes the input row address signal Ar. The output signal of row decoder 33 is supplied to word line driver 35. The output terminals of word line driver 35 are connected to word lines WL (WL1 to WLn). Word line driver 35 sets in an active or high level (H level) the voltage in the word line WL on the row as specified by the address signal. Memory cells 41 are connected to each word line WL. The number of memory cells connected to each word line WL is equal to the number of columns.

The arrangement of each memory cell 41 will be given. Transfer gates 43 and 45 are turned on or off depending on voltage level in the word line WL. One end of the current path of first transfer gate 43 is connected to first bit line which is one of bit lines BL to be given later. One end of the current path of second transfer gate 45 is connected to the other, or second bit line BL bar. The other end of the current path of transfer gate 43 is connected to the drain of first N channel MOS transistor 47 and the gate of second N channel MOS transistor 49. The other end of the current path of the second transfer gate 45 is connected to the drain of second transistor 49 and the gate of first transistor 47. The sources of first and second transistors 47 and 49 are connected to ground level (Vss). Transistors 47 and 49 form a drive transistor pair of memory cell 41. Resistor 53 is inserted between the terminal applied with power source voltage VDD (referred to as a power voltage VDD applying point) and a connection point 51 of the drain of transistor 47 to the gate of transistor 49. Resistor 57 is connected between power voltage VDD applying point and a connection point 55 of the drain of second transistor 49 to the gate of first transistor 47. These transistors 47 and 49 and resistors 53 and 57 constitute flip-flop circuit FF for holding data.

A pair of bit lines BL and $\overline{BL}$ are provided for each column. These bit lines BL and $\overline{BL}$ are commonly connected to the memory cells 41 on the same column.

Column select switch circuit 61 is provided for each column. Bit lines BL and $\overline{BL}$ are connected to column select switches 61. Column select switch circuit 61 comprises, for example, first and second N channel MOS transistors 63 and 65, as given below. One end of the current path of first transistor 63 is connected to the first bit line BL. The gates of first and second transistors 63 and 65 are connected to the output terminal of a column decoder to be given later. The other ends of first and second transistors 63 and 65 are connected to sense amplifier 17 and write circuit 15.

A select signal input terminal (corresponding to the gates of transistors 63 and 65) of each column select switch 61 is connected to the output terminal of column decoder 19. Column decoder 19 receives column address signal as input data and decodes the input data. On the basis of the decoding result, column decoder 19 applies a column select signal in an active level, e.g. H level, to column select switch circuits 61. Similarly, on the basis of the decoding result, column decoder 19 transfers a column select signal in nonactive or low level, e.g. L level, to column select switch circuits 61. Although not shown, column select switch circuits 61 in the columns with the same address are connected to one output terminal of column decoder 19. Therefore, if one word consists of 8 bits, the same column select signal is applied to 8 columns with the same address.

Column select switch circuit 61 is connected to the output terminals of the corresponding write circuit 15. The input terminals of write circuit 15 are connected to the output terminals of input buffer 71. Column select switch 61 is connected to the input terminals of sense amplifier 71. The output terminals of sense amplifier 17 are connected to output buffer 73.

Bit line BL is connected to the first ends of the current paths of two P channel MOS transistors 81 and 83. The second ends of the current paths of transistors 81 and 83 are connected to power voltage VD applying point. Transistors 81 and 83 constitute circuit 85 for bit line BL. The second end of bit line $\overline{BL}$ is connected to the first ends of the current paths of P channel MOS transistors 87 and 89. The second ends of the current paths of transistors 87 and 89 are connected to power voltage VDD application point. Both transistors 87 and 89 form load circuit 91 for bit line $\overline{BL}$. The first end of the current path of transistor 93 is connected to the first bit line BL. The second end of the current path of transistor 93 is connected to the second bit lines BL. Transistor 93 is provided to equalize the voltages in bit lines BL and $\overline{BL}$.

Applied to the gates of transistors 81 and 87 are control signal S1 which is in H level when memory section 11 is in a selected state, and in L level when it is in a nonselected state. Control signal S2 is applied to the gates of transistors 83, 89 and 93. This control signal is in L low level during a fixed period within the nonselected period of memory section 11, while keeping a pulse shape of waveform. The load ability, i.e. current feeding ability, of transistors 83 and 89 is set to be larger than that of transistors 81 and 87.

The operation of the S-RAM device shown in FIGS. 1 and 2 will be described referring to FIGS. 3A through 3I.

The operation of the memory device in the read out mode will first be given.

It is assumed that column address signal Ac varies as shown in FIG. 3A. Section decoder 21 selects one driver 13 and one column decoder 19. The address signal to specifying columns, which is contained in column address signal Ac, is transferred to the column decoder. The selected column decoder 19 enables column gate circuits 61 in the selected columns.

This operation will be described in more detail. It is assumed that address signal specifying section which in contained in row address signal Ar specifies the first row of the memory matrix, and that column address signal Ac designates the first to 16th rows in the first section. Section decoder 21 selects drivers 13-1 and column decoder 19-1. The address signal specifying the columns, which is contained in column address signal Ac, and the outputs of section decoder 21 are transferred to column decoder 19-1. The output of column decoder 19-1 is input to column gate circuit 61.

Section decoder 21 supplies control signal S1 in H level as shown in FIG. 3B to the transistors 81 and 87 in memory section 11. The decoder 21 supplies control signal $\overline{S1}$ in L level as shown in FIG. 3C to transistors 81 and 87 of nonselected memory sections 11. The variation of signal S1 in FIG. 3B indicates that before the address is changed, that section was not selected, and the variation of the address signal causes it to be in selected state. The variation of signal $\overline{S1}$ in FIG. 3C indicates that before the address is changed, the section was selected, and the change of the address signal causes it to be in nonselected state.

Signal S2 is supplied to transistors 83, 89 and 93. After the address signal is varied, this signal S2 is pulsed to L level and kept in this level during a fixed period of time, as shown in FIG. 3D. Applied to nonselected memory section 11 is control signal S2 in H level.

Next, the signal S2 supplied to the selected section is pulsed to H level. After signal S2 is pulsed to H level, the voltage of the word line WL specified by a row address signal is made to go high as shown in FIG. 3F. Subsequently, data will be read out from the selected memory cell 41.

With the control signals thus supplied, the bit lines and the transistors operate as given below. In the selected memory section 11, signal S1 is in H level, and transistors 81 and 87 are in the off state. Transistors 83, 89 and 93 are turned on only during the period of L level of signal S2. As a result, during the L level period of signal S2, a pair of bit lines BL and BL are precharged up to power voltage VDD through transistors 83 and 89, as shown in FIGS. 3G and 3H. At the same time, the voltages in both bit lines BL and $\overline{BL}$ are equalized through transistor 93. As a result, as shown in FIG. 3H, the voltage in the bit line (here it is $\overline{BL}$ line), which has been at ground voltage, is increased to power voltage VDD. After the voltages of the bit lines BL and $\overline{BL}$ both reach power voltage VDD, the signal S2 goes high. Therefore, transistors 83, 89 and 93 are turned off, and the precharge equalizing operation terminates. Then, the voltage in the word line WL goes high. Transfer gates 43 and 45 in memory cell 41 are turned off. With the turning on of these transistors, the data as stored in flip-flop FF is read out through transfer gates 43 and 45 to bit lines BL and $\overline{BL}$. The voltage of the bit line (in this embodiment, bit line BL) to which "1" data is to be read out is kept at H level, as shown in FIG. 3G. The voltage in the bit line (in this embodiment, bit line $\overline{BL}$) to which "0" data is to be read out gradually decreases by discharging through transistors 45 and 49, as shown in FIG. 3H. The column select circuit 61 for the selected columns has been enabled by the signal from column decoder 19. As a result, the voltages in bit lines BL and $\overline{BL}$ are supplied through column select circuit 61 to sense amplifier 17. Then, sense amplifier 17 reads out the data.

In the nonselected memory sections 11, signal S2 is kept in H level. Accordingly, transistors 83, 89 and 93 are in the off state. Since signal $\overline{S1}$ is in low level, however, transistors 81 and 87 are turned on, so that bit lines BL and $\overline{BL}$ are charged to voltage VDD, as shown in FIGS. 3I and 3J. Because the load capacity of transistors 81 and 87 is lower than that of transistors 83 and 89, the slope of the curve representing a variation of the voltage in bit line $\overline{BL}$ from L to H level as shown in FIG. 3J is more gentle than that of the curve representing the variation of the voltage in bit line $\overline{BL}$ in the selected section from L to H level as shown in FIG. 3H. On the other hand, in the nonselected section, the voltages in the word lines are kept in L level. Accordingly, the transfer gates 43 and 45 in memory cell 41 are in the off state.

In the memory device according to the above-mentioned embodiment, in the selected memory section 11, bit lines BL and $\overline{BL}$ are precharged before the memory selecting operation (drive of word line WL). After the memory cell is selected, i.e. word line is driven, the voltage in the bit line for "0" data is merely discharged. Therefore, in the read-out mode no through-current flows. Further, in the nonselected memory section, the transfer gates 43 and 45 in the memory cell are not turned on. For this reason, no through-current flows even if transistors 83 and 89 are turned on. Thus, according to this embodiment, the consumed current in the memory cells of the static type can be reduced considerably. Further, since the precharge time (L level duration of signal S2) is fixed, as the cycle time is longer, the power dissipation of the memory device when it is operated is more reduced.

In a conventional memory device, the discharge of the bit line for reading out "0" data from the memory cell is performed under conditions that the transistor for pulling up the voltage in the bit lines to the power voltage is in an on state. For this reason, the pull-up transistor blocks the discharge operation of the bit line for "0" data. It is noted here that, in the memory device of the above-mentioned embodiment, there is no component to block the discharge of that bit line. This fact implies that the discharge time of this memory device is shorter than that of the conventional one. The discharge time of the "0" data bit line occupies a large part in the read out cycle of the memory device. In this respect, the memory device according to this invention allows a high speed read out operation. Further, the memory cell select operation, i.e. the precharge operation prior to the word line select operation, is executed by transistors 83 and 89 with good load ability. In the conventional memory device, improvement of the current feed capacity of the transistors forming the bit line load circuit was limited because its improvement is inevitably accompanied by a long discharge time of the bit line. On the other hand, this embodiment allows use of the transistors with sufficiently large current feed capacity. Accordingly, the precharge time (L level duration of signal S2) may be very short. Thus, provision of the precharge time does not create any problem in attaining a high speed read out operation.

While the read out operation of the S-RAM device, of this embodiment has been described, this device is also operable with low power dissipation and at a high speed during the write operation. In the write mode, an H level signal S1 is supplied to the select section, and at the same time L level signal S2 is supplied to the same, as in the read mode. With application of these signals, bit lines BL and $\overline{BL}$ are precharged, and the voltages in these lines are equalized. After the completion of the precharge operation, the word line is driven, and data is written into the memory cells by write circuit 15.

Figure 4:
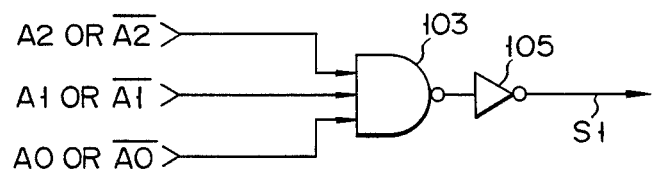
FIG. 4 shows a circuit diagram illustrating the structure of a section decoder shown in FIGS. 1 and 2.
Figure 5:
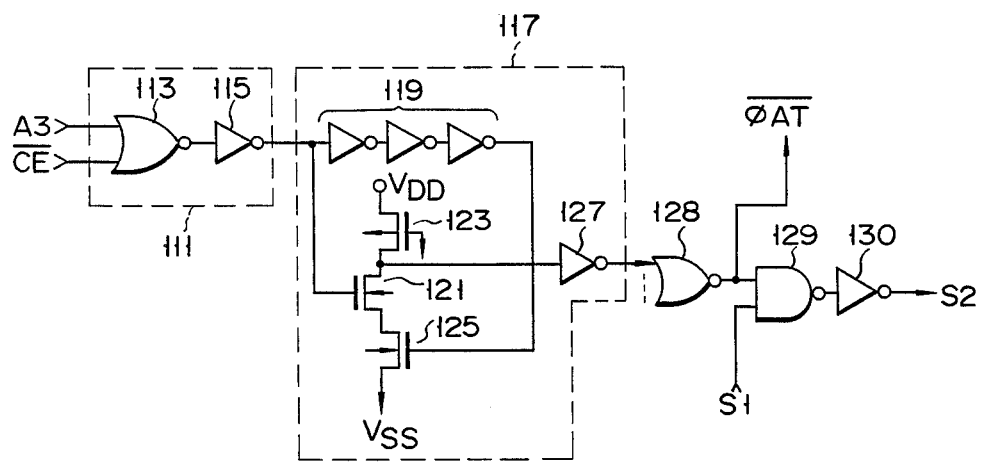
FIG. 5 shows a circuit diagram illustrating the structure of a circuit to produce a signal S2 shown in FIG. 3E.

A detailed circuit arrangement of the circuit for generating signals S1 and S2 will be described referring to FIGS. 4 and 5. For signal S1, the section select signal output from section decoder 21 can directly be used. An arrangement of a section decoder for selecting respective sections is illustrated in FIG. 4. Of the column address signal, the data with bits (3 bits in FIG. 4) to specify the section are appropriately inverted and input to NAND gate 103. The output signal from NAND gate 103 is inverted by inverter 105, and output as signal S1. In the case of FIG. 4, for example, signal S1 goes high when data A1 and A2 are in L level and data A0 is in H level. Such arrangement is provided for each section 11, to form section decoder 21.

A detailed arrangement of the circuit for outputting signal S2 will be described referring to FIG. 5. The data of one bit in the column address signal Ac and chip enable signal $\overline{CE}$ are input to address buffer 111. Address butter 111 comprises, for example, NOR gate 113 for receiving the one-bit data and chip enable signal CE, and inverter 115 for inverting and outputting the output signal of NOR gate 113. The output signal of address buffer 111 is input to address transition detector (ATD) circuit 117.

An arrangement of ATD circuit 117 will be given below. The output signal of address buffer 111 is supplied to delay circuit (inverters) 119. The same signal is also applied to a circuit for detecting a change of signal level. An arrangement of this level change detecting circuit follows. The output signal of input buffer 111 is supplied to the gate of N channel MOS transistor 121. One end of the current path of this transistor 121 is connected to one end of that of P channel MOS transistor 123. The other end of the current path of transistor 123 is connected to power voltage VDD applying point. The gate of transistor 123 is grounded. The other end of the current path of transistor 121 is connected to one end of that of N channel MOS transistor 125. The other end of the current path of transistor 125 is grounded. The output signal of delay circuit 119 is connected to the gate of transistor 125. Voltage at a node between transistors 121 and 123 is output as the output signal of circuit 117, through inverter 127. With such an arrangement, the level change detector circuit produces a pulse signal which is kept in H level during a predetermined period of time (corresponding to the delay time by delay circuit 119) when bit data changes. The circuit thus arranged is provided for each bit. The output signal of this circuit arrangement for each bit is input to NOR gate 128. The output signal of gate 128 is input to NAND gate 129. Further applied to NAND gate 129 is signal S1. The output signal of NAND gate 129 is input to inverter 130. The output signal of inverter 130 is used as signal S2. By the circuit arrangement of FIG. 5, a pulse signal with a fixed pulse width can be obtained if the data of the address signal changes even if the change is one bit. The arrangement of the section decoder is not limited to that of FIG. 4. The same thing is true for the signal S2 generating circuit shown in FIG. 5. If necessary, these circuits may be any other known circuits.

Figure 6:
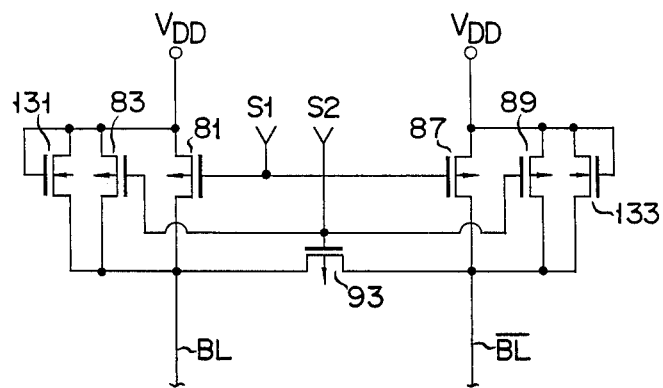
FIG. 6 shows a circuit diagram showing the structure of a bit line load circuit according to another embodiment of the present invention.

In the circuit arrangement shown in FIG. 2, when the voltage of the bit line for reading out "0" data perfectly reaches ground potential, there is a danger that the L level period of signal S2 is elongated. This period corresponds to that from an instant that the bit line voltage is pulsed from ground potential to power voltage VDD. To cope with this, it is advantageous to use a bit line load circuit as shown in FIG. 6. The circuit arrangement of FIG. 6 is equal to that of FIG. 2 except that two N channel MOS transistors are additionally provided for the bit line load circuits of FIG. 2. Use is made of like reference symbols for designating like portions in FIG. 2. In FIG. 6, the current paths of transistors 83 and 89 forming the bit line load circuit are connected in parallel with the current paths of N channel MOS transistors 131 and 133. The gates and sources of these transistors 131 and 133 are applied with voltage VDD.

With such an arrangement, when the voltages in bit lines BL and $\overline{BL}$ are close to H level, N type MOS transistors are in the off state and therefore not influenced by a change of the bit line voltages. As the voltages of the bit lines BL and $\overline{BL}$ gradually drop, transistors 131 and 133 gradually turn on to charge bit lines BL or $\overline{BL}$. Accordingly, a slope of the curve representing a variation of the voltage in the bit line for reading out "0" data toward L level is slightly more gentle in the latter half when compared to that of the case shown in FIG. 3H, and the voltage of the bit line never reaches the ground level. Further, if the current feed ability of these transistors 131 and 133 are set to be relatively small, the increase of the current consumption is not large. Additionally, transistors 131 and 133 do not operate until the voltage of the bit line is reduced to some degree. When transistors 131 and 133 start to operate, sense amplifier 17 finishes data output. The use of these transistors has little influence on the operating speed of the memory device. Additionally, since transistors 131 and 133 automatically operate according to their characteristics, an additional special control circuit is not required.

Figure 7:
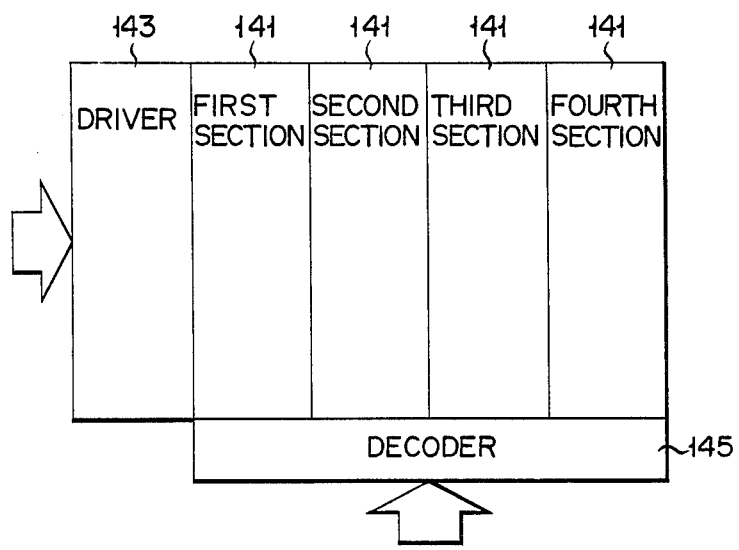
FIG. 7 shows a block diagram illustrating a memory device according to another embodiment of the present invention.

In the above-mentioned embodiment, the present invention is applied to the arrangement of the memory device in which the memory sections 11 are paired, and driver 13 is inserted between between the paired memory sections. This invention is applicable for the memory device arranged such that a single driver 143 may be provided for a plurality of memory sections 141, as shown in FIG. 7. Such a memory device with a memory array consisting of a plurality of memory sections has been disclosed by Isobe et al. in their paper in 1984 IEEE International Solid-State Circuit Conference, pp 214 to 216.

Further, a memory device with a called auto power down mechanism to reduce the power dissipation of the memory device, has been proposed in IEEE JOURNAL OF SOLID-STATE CIRCUITS, VOL. sc-19, No. 5 OCTOBER 1984 pages 578 to 585, "A Low Power 46ns 256 kbit CMOS Static RAM with Dynamic Double Word Line." by T. Sakurai et al. This invention is effectively applicable for the memory device with the auto power down function. In this type of memory device, the auto power down will not function during the write cycle, and therefore the through current flows into the bit lines. In this respect, the reduction of power dissipation is insufficient. If this invention is applied for such a memory device, the power dissipation can effectively be reduced.

Figure 8:
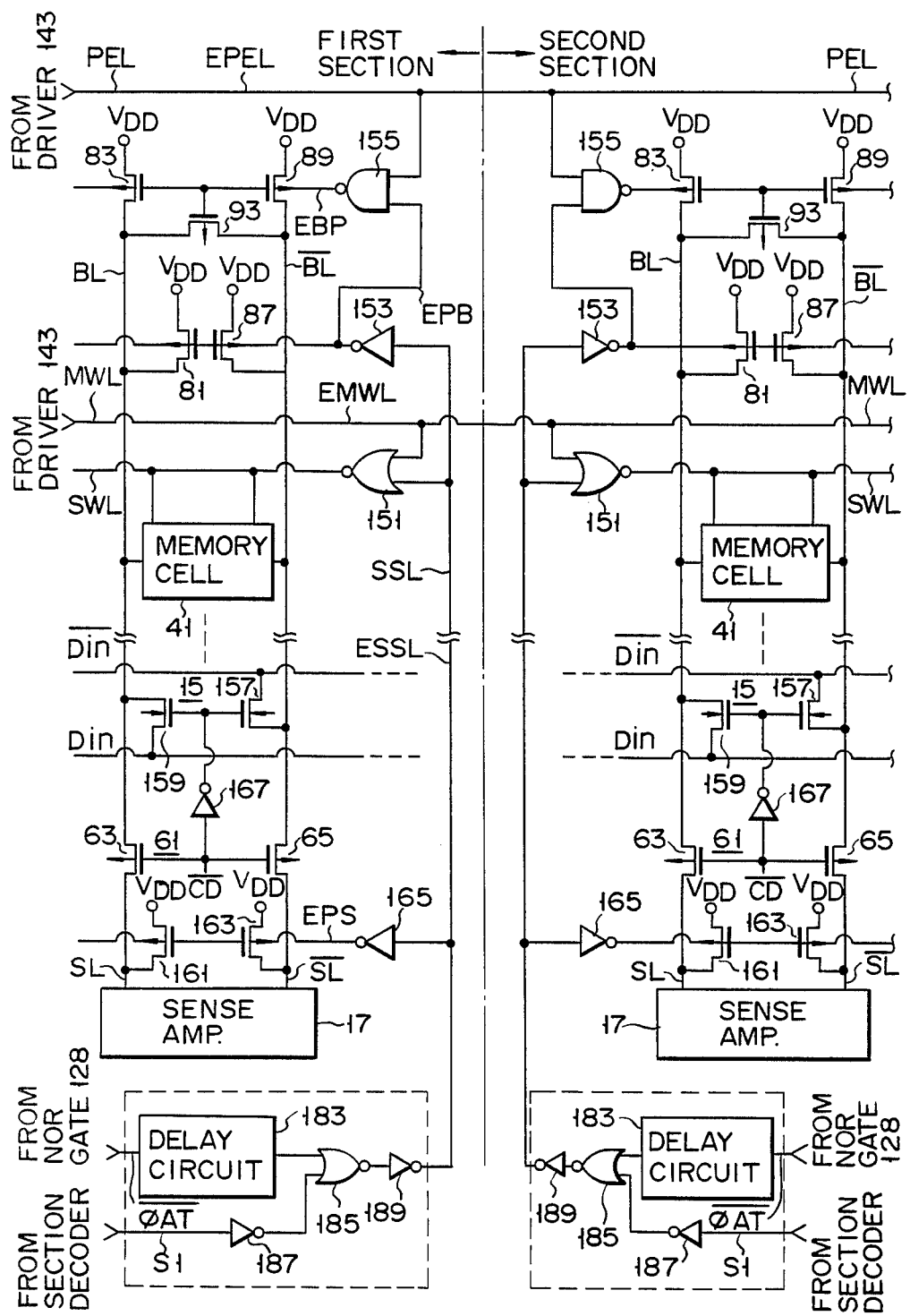
FIG. 8 shows a circuit diagram for illustrating a detailed structure of a memory section shown in FIG. 7.

An embodiment wherein the present invention is applied as memory device with the auto power down function in which a single driver is provided for several memory sections, will be described referring to FIGS. 7 through 9.

In this embodiment, the memory cell array is divided into four memory sections, as shown in FIG. 7. A single driver 143 is provided for four memory sections 141. A column decoder 145 is provided for each memory section. FIG. 8 is a circuit diagram useful in explaining in detail the internal structure of each memory section. Since the memory sections have the same structures, in FIG. 8, only the first and second memory sections will typically be illustrated. Further, in each section, the column structures are equal, and hence one column in each of the first and second memory sections is typically illustrated in FIG. 8. In FIG. 8, like reference symbols designate like portions in FIG. 2. The auto power down construction per se is discussed in many articles and well known in this field. Hence, no further explanation will be given in this specification.

An arrangement of the memory device shown in FIG. 8 will be described. For ease of understanding, description will be given putting an emphasis on a memory section 41 in the first section in FIG. 8. The signals traveling on signal lines will be designated by reference numerals of the signals lines headed by "E".

Main word lines MWL are provided common to the first to fourth sections 141. This word line is provided for each row of the memory matrix. Precharge equalize line PEL is provided common to the first to fourth sections 141. These lines MWL are connected to driver 143 shown in FIG. 7. Each section contains section select line SSL. One end of each section select line SSL is connected to the output terminal of select circuit 181. Circuit 181 includes delay circuit 183, NOR gate 185 and inverters 187 and 189. The delay circuit 181 receives signal $\overline{\phi AT}$ from NOR gate 128. Output signal of circuit 183 is input to NOR gate 185. Signal S1 is also applied to NOR gate 185 through inverter 187. The output signal of NOR gate 185 is supplied to section select line SSL through inverter 189. The other end of section select line SSL is connected to one of the input terminals of NOR gates 151 in the corresponding section. The other input terminal of NOR gate 151 is connected to main word line MWL. The output terminal of NOR gate 151 is connected to word line MWL. The output terminal of NOR gate 151 is connected to section word line SWL. In FIG. 8, section word line SWL and NOR gate 151 are illustrated once for one column. Actually, it is provided for each section. Memory cells 41 of the number corresponding to that of columns are connected to each section word line SWL. Section select line SSL is further connected to the input terminal of inverter 53. The output terminal of inverter 153 is connected to one of the input terminals of NAND gate 155. The other input terminal of NAND gate 155 is connected to precharge equalize line PEL. The output terminal of NAND gate 155 is connected to the gates of transistors 83, 89 and 93. Transistors 81, 83, 87 and 89 form a bit line load circuit. Transistor 93 is provided for equalizing the voltages in bit lines BL and $\overline{BL}$. Connected to the paired bit lines BL and $\overline{BL}$ is write circuit 15. Write circuit 15 is constructed with transistors 157 and 159. One end of the current path of transistor 157 is connected to data input line $\overline{Din}$. The other end of the current path is connected to bit line $\overline{BL}$. One end of the current path of transistor 159 is connected to data input line Din, while the other end to bit line BL.

The first ends of bit lines BL and $\overline{BL}$ are connected to column select circuit 61. Column select circuit 61 is connected to sense amplifier 17, through sense lines SL and $\overline{SL}$. Connected to the sense lines SL and $\overline{SL}$ are transistors 161 and 163 for pulling up the voltages in sense lines SL and $\overline{SL}$, like transistors 81 and 87. The gates of transistors 161 and 163 are connected to the output terminal of inverter 165. The input terminal of inverter 165 is connected to section select line SSL. Column select signal $\overline{CD}$, which is in L level when the column is selected, is supplied from a column decoder (not shown) to column select circuit 61. The signal $\overline{CD}$ is applied through inverters 167 to the gates of transistors 157 and 159 forming write circuit 15. Section select circuit 181 has a power down function during the read out cycle.

The operation of the memory device with the structure shown in FIGS. 7 and 8 will be described.

The operation of the memory device in the read out mode will be described referring to FIGS. 9A to 9F. It is assumed that an address signal varies as shown in FIG. 9A, and that the memory section 41 in the first section in FIG. 8 is selected. After the address signal changes, driver 143 sets the voltage EPEL in precharge equalize line PEL in H level during a predetermined period of time. Section decoder 143 sets the voltage in section select line SSL in L level, as shown in FIG. 9C. Then, the output signal EPB of inverter 153 and the output signal EPB of inverter 165 go high as shown in FIG. 9D. Responsive to the output signal EPS of inverter 153 and the signal EPEL, the output signal (bit line precharge signal EBP) of NAND gate 155 goes low as shown in FIG. 9E. Accordingly, transistors 83, 89 and 93 are turned on to precharge bit lines BL and $\overline{BL}$ and to equalize the voltages in these lines. After a predetermined period of time elapses, and the precharge/equalize operation of the bit lines is completed, signal EPEL goes low. The output signal EBP of NAND gate 155 goes high as shown in FIG. 9E. Then, the voltage in the main word line MEL goes low. Further, the output signal of NOR gate 151, i.e. the voltage in word line SWL, goes high to select memory cell 41. The voltages in bit lines BL and $\overline{BL}$ in the select section are set according to the data in select memory cell 41. That is, the bit line for "1" data keeps voltage VDD, and the bit line for "0" data varies from voltage VDD to ground potential.

When that column is selected, the column select signal $\overline{CD}$ from a column decoder (not shown) goes low. The transistors 63 and 65 constituting column gate circuit 61 are turned on, and the data stored in the memory cell as selected goes to sense amplifier 17 through bit lines BL and $\overline{BL}$ and sense lines SL and $\overline{SL}$. It is amplified by sense amplifier 17 and output. The output data of sense amplifier 17 is latched in a latch circuit (not shown). During this period from the precharge to the latching of data, bit line pull-up transistors 81 and 87 are kept in off state by the output signal EPB (high level) of inverter 153 shown in FIG. 9D. Similarly, sense line pull-up transistors 161 and 163 are kept in the off state by the output signal EPS (high level) of inverter circuit 165 shown in FIG. 9D.

After a predetermined period of time elapses from the address signal change, by the auto power down functions, in the select section, the voltage ESSL of section select line SSL goes high as shown in FIG. 9C. The output signals from inverters 153 and 165 go low, so that transistors 81, 87, 161 and 163 are turned on, and the voltages of bit lines BL and $\overline{BL}$, and sense lines SS and $\overline{SS}$ are pulled to voltage VDD. The voltage ESWL of section word lines SWL goes low as shown in FIG. 9F, and the transfer gates in memory cell 41 are turned off and no through current flows.

In the read out mode, the voltages of write control signal lines Din and $\overline{Din}$ is in H level. Write control transistors 157 and 159 are turned off and does not influence the operation of bit lines BL and $\overline{BL}$.

Then, it is assumed that the address signal changes, and the intended memory cell is in nonselected state. In this case, another section is selected, and signal EPEL is in H level during a fixed period of time. The voltage of section select line SSL stays at H level. The voltage of the signal ESWL in section word line SWL stays at L level. Therefore, the transfer gates of memory cells 41 remains in the off state. As a result, no through current flows. Transistors 81, 87, 161 and 163 are kept in the on state. The voltages of bit lines BL and $\overline{BL}$, and senses lines SL and $\overline{SL}$ are in H level.

In the read out mode, the through current never flows through bit lines BL and $\overline{BL}$. In the read out mode, power dissipation is remarkably reduced when compared with that of the conventional memory device. The shorter the cycle time in the read out mode and the smaller the power dissipation are obtained. Further, in the read out mode, the voltage of the lower voltage bit line decreases quickly. This fact indicates reduction of the access time in the read out mode.

The operation of the key portions in the memory device in the write mode will be described referring to FIGS. 10A to 10F.

It is assumed that the address signal changes as shown in FIG. 10A, and the desired memory cell is selected. Bit line precharge signal EPEL is pulsed from low to high level, as shown in FIG. 10B. Selection select signal ESSL goes low, as shown in FIG. 10C. Under this condition, the output signal EPB of inverter 153 and the output signal EPS of inverter 165 go high as shown in FIG. 10D. The output signal EBS of NAND gate 155 is pulsed to L level, as shown in FIG. 10E. As a result, transistors 83, 89 and 93 are turned on, and bit lines BL and $\overline{BL}$ are precharged and the voltages in these lines are equalized. The signal in the section word line goes high as shown in FIG. 10F, to select memory cell 41. The sequence of the operations of the memory device in the write mode is similar to that in the read out mode. Then, data is written into memory cell 41. For writing a "1", for example, into the memory cells, the voltage of lines Din is pulled up to voltage VDD, while the voltage of lines $\overline{Din}$ is pulled down. In the select column, the column select signal $\overline{CD}$ from the column decoder (not shown) is in L level, the output signal from inverter 167 is in H level, transistors 157 and 159 are turned on, and the voltages in bit lines BL and $\overline{BL}$ are set to voltage VDD-VTHN (VTHN is threshold voltage of N channel transistor.) and ground potential or vice versa. In the nonselected column, the output signal (L level) of inverter 167 turns off transistors 157 and 159. The voltages of bit lines BL and $\overline{BL}$ change according to the data stored in the selected memory cell 41. In the write mode, the power down function is inactive. In the select section, the signal ESSL in section select line SSL keeps L level until the next address signal comes in, as shown in FIG. 10C. With the signal ESSL kept in L level, the selected state of section word line SWL, the off state of bit line pull-up transistors 81 and 87, and the off state of sense line pull up transistors 161 and 163 continues till the next address signal comes in.

In the write mode, the through current never flows through bit lines BL and $\overline{BL}$. Power dissipation is considerably reduced compared with that of the conventional memory device. Further, when the cycle time is elongated, the power dissipation is reduced inversely proportional to the cycle time. Further, the write time can be reduced for the same reason as that for the read out mode.

In the above-mentioned embodiments, the word line is driven after the precharge operation of the bit lines is completed. In an alternative embodiment, the word line is driven near the end of the precharge operation, although it would be accompanied by some increase of power dissipation. To operate this device at a high speed, it is desirable to set the precharge time as short as possible. As for the time from the address signal change till word line WL or SWL is pulsed from L to H level, it is preferable accordingly that the signal delay in driver 13 is minimized, and the precharge operation is maximized.

What is claimed is:

1. A semiconductor memory device comprising:
    a memory cell array including memory cells arranged in a matrix of rows and columns, said array having a plurality of sections, each section including memory cells belonging to at least one column;
    a plurality of bit lines for writing data to and reading data from said memory cells, a pair of said bit lines being provided for each column and connected to memory cells in the corresponding column;
    word lines connected to corresponding memory cells to select memory cells in the row direction; and
    precharge means connected to said bit lines, for receiving and for detecting the contents of an address signal, said precharge means being responsive to said address signal to charge, during a predetermined period, said bit lines in at least one selected section which includes at least one memory cell designated by said address signal, and to charge said bit lines in at least one nonselected section.

2. A semiconductor memory device according to claim 1, in which said semiconductor memory device further includes means for driving said word lines, said word line drive means activates the voltage of said word lines corresponding to the address signal after the charging of said bit lines in said selected section by said precharge is substantially completed.

3. A semiconductor memory device aaccording to claim 1, in which said precharge means includes:
    precharge transistor means connected to said bit lines and to a predetermined voltage;
    menas for receiving said address signal and for detecting the contents of said change in a received address signal; and
    means for turning on during said predetermined period said precharge transistor means connected to said bit lines in said selected section according to the output signal of said address signal change detecting means, and for turning on said precharge transistor measn connected to said bit lines of said nonselected section.

4. A semiconductor memory device according to claim 3, in which said precharge transistor means includes at least one first transistor and at least one second transistor connected to said bit lines and to said predetermined voltage, said turning on means, according to the output signal of said address signal change detecting means, turns on said first transistor in the selected section during said predetermined period, turns off said seocnd transistor connected to said bit lines in said selected section, turns off said first transistor connected to said bit lines in the nonselected section, and turns on said second transistor connected to said bit lines of the nonselected section.

5. A semiconductor memory device according to claim 4, in which the current feed capacity of said first transistor is larger than that of said second transistor.

6. A semiconductor memory device according to claim 4, further comprising third transistors provided for each column, the current path of each of said third transistors being connected at one end to one of said paired bit lines in said column, and at the other end to the other bit line, in which said turning on means turns on said third transistor when said first transistor is turned on, and equalizes the voltages of both said bit lines.

7. A semiconductor memory device according to claim 4, further comprising column select means connected to said bit lines and for driving the voltages of said bit lines in said selected section in the read out mode; sense lines connected to the output terminal of said column select means and provided one for each column;
- sense amplifiers connected to said sense lines and for sensing the voltages in said sense lines and amplifying the sensed voltage;
- transistor means for pulling up voltage of sense lines, connected to said sense lines and to said predetermined voltage; and wherein
- said turning on means turns off said sense line pulling up transistor means in said selected section and turns on said sense line pulling up transistor means in said nonselected section to pull up the voltage of said sense lines in said nonselected section.

8. A semiconductor memory device according to claim 3, further comprising N channel MOS transistors, of which the current path is connected at one end to said bit lines and at the other end to said predetermined voltage, and at the gate to the other end of said current path.

9. A semiconductor memory device comprising:
- a memory cell array including memory cells arrayed in a matrix, said array having a plurality of sections, each section including memory cells belonging to at least one column;
- a pair of bit lines for writing and reading out data to and from said memory cells, each pair of said bit lines being provided for each column, said bit lines being connected to memory cells in the corresponding column;
- word lines connected to corresponding memory cells to select memory cells in the row direction;
- at least one first transistor and at least one second transistor connected to a corresponding at least one bit line and a terminal applied with a predetermined voltage;
- precharge means, connected to said first second transistors, for receiving an address signal and for detecting the contents of said address signal and a change in the contents of said address signal, said precharge means turning on said first transistor connected to the bit line in a selected section which includes at least one memory cell designated by the address signal, during a predetermined period after a fixed period elapses from a change in the contents of the address signal, turning off said second transistor connected to the bit lines in said selected section, turning off said first transistor connected to the bit lines in at least one nonselected section, and turning on said second transistors connected to the bit lines in said nonselected section to charge the bit lines in said nonselected section; and
- a row decoder connected to said word lines, for receiving and for detecting the contents of said address signal and a change in the contents of said address signal, said row decoder activating, in response to said address signal, the voltage of the word line specified by the address signal, after the charge of the bit lines in said selected section by said precharge means is substantially completed, and said predetermined period of time elapses after the contents of the address signal change.

10. A semiconductor memory device according to claim 9, further comprising N channel MOS transistors, of which the current path is connected at one end to said bit line and at the other end to said predetermined voltage, and at the gate to the other end of said current path.

11. A semiconductor memory device according to claim 9, further comprising third transistors provided for each column, the current path of each of said transistors being connected at one end to one of said paired bit lines in said column, and at the other end to the other bit line, said turning on means turning on said third transistor when said first transistor is turned on, and equalizing the voltage of both said bit lines.

* * * * *